United States Patent
Baader et al.

(10) Patent No.: US 7,313,498 B2
(45) Date of Patent: Dec. 25, 2007

(54) DEVICE AND METHOD FOR TESTING AN ELECTRICAL CIRCUIT

(75) Inventors: Peter Baader, Munich (DE); Tilman Neunhoeffer, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/372,470

(22) Filed: Mar. 9, 2006

(65) Prior Publication Data

US 2006/0212236 A1    Sep. 21, 2006

Related U.S. Application Data

(63) Continuation of application No. PCT/DE2004/002011, filed on Sep. 7, 2004.

(30) Foreign Application Priority Data

Sep. 12, 2003  (DE)  ................ 103 43 346

(51) Int. Cl.
*G06F 19/00*  (2006.01)
(52) U.S. Cl. .................... 702/124; 702/57; 702/183
(58) Field of Classification Search ............. 702/57, 702/58, 64, 117, 120, 124, 183; 324/225, 324/500, 512, 523; 700/38, 39; 714/727, 714/728
See application file for complete search history.

(56) References Cited

U.S. PATENT DOCUMENTS

| | | | | |
|---|---|---|---|---|
| 3,851,161 A | * | 11/1974 | Sloop | ................ 716/4 |
| 4,590,472 A | * | 5/1986 | Benson et al. | ......... 340/870.04 |
| 4,837,502 A | * | 6/1989 | Ugenti | ............ 324/523 |
| 5,488,323 A | * | 1/1996 | Beacham et al. | ............ 327/74 |
| 5,588,142 A | | 12/1996 | Sharrit | |
| 5,831,437 A | * | 11/1998 | Ramadoss et al. | .......... 324/537 |

(Continued)

FOREIGN PATENT DOCUMENTS

DE       41 42 393 A1    7/1992

(Continued)

OTHER PUBLICATIONS

Delgado-Frias et al., 'A Programmable Dynamic Interconnection Network Router with Hidden Refresh', Nov. 1998, IEEE Publication, vol. 45, No. 11, pp. 1182-1190.*

Lynch, 'Measurement of Equivalent Electrical Circuit of a Piezoelectric Crystal', Nov. 1949, POERS, pp. 323-331.*

(Continued)

*Primary Examiner*—Carol S. W. Tsai
*Assistant Examiner*—Elias Desta
(74) *Attorney, Agent, or Firm*—Slater & Matsil, L.L.P.

(57) ABSTRACT

A method and device for testing an electrical circuit, which do not require a thorough electrical circuit simulation but reliably identifying circuit faults. Preferred embodiments generate a fault signal that indicates that a given state of the circuit, which is defined by an electrical state variable, could occur in an electrical circuit. Generally, electrical components are individually treated as short-circuited or nonconducting regarding each pair of connections of the components. An electrical state variable is permanently allocated to at least one network node or a connecting pin of the electrical circuit. Electrical state variables of the network nodes and connecting pins of the components that are to be treated as short-circuited are allocated to each network node and each connecting pin. An assessment is made at least based on the allocated state variables as to whether the given circuit state can occur.

20 Claims, 5 Drawing Sheets

U.S. PATENT DOCUMENTS

| | | | |
|---|---|---|---|
| 6,570,400 B2* | 5/2003 | Habersetzer et al. | 324/763 |
| 7,073,111 B2* | 7/2006 | Whetsel | 714/727 |
| 2003/0093504 A1 | 5/2003 | Neunhoeffer et al. | |
| 2003/0120981 A1 | 6/2003 | Neunhoeffer et al. | |

FOREIGN PATENT DOCUMENTS

DE        696 16 416 T2     11/1996

OTHER PUBLICATIONS

Bolsens, I., et al., "Electrical debugging of synchronous MOS VLSI circuits exploting analysis of the intended logic behaviour," 26th ACM/IEEE Design Automation Conference, Jun. 25-29, 1989, Paper 32.3, pp. 513-518.

Dagenais, M.R., et al., "Transistor-Level Estimation of Worst-Case Delays in MOS VLSI Circuits," IEEE Transactions on Computer-Aided Design of Integrated Circuits and Systems, vol. 11, No. 3, Mar. 1992, New York, US, pp. 384-395.

Hübner, U., et al., "Partitioning and Analysis of Static Digital CMOS Circuits," IEEE Transactions on Computer-Aided Design of Integrated Circuits and Systems, vol. 16, No. 11, Nov. 1997, pp. 1292-1310.

Auvergne, D., et al., "Formal Sizing Rules of CMOS Circuits," IEEE 1991, pp. 96-100.

Usami, K., et al., "Clustered Voltage Scaling Technique for Low-Power Design," Proceedings of the ACM International Symposium on Low Power Electronics and Design, 1995, pp. 3-8.

* cited by examiner

DEVICE AND METHOD FOR TESTING AN ELECTRICAL CIRCUIT

This application is a continuation of co-pending International Application No. PCT/DE2004/002011, filed Sep. 7, 2004, which designated the United States and was not published in English, and which is based on German Application No. 103 43 346.5, filed Sep. 12, 2003, both of which applications are incorporated herein by reference.

TECHNICAL FIELD

This invention relates generally to devices and methods, and more specifically to devices and methods for testing electrical circuits.

BACKGROUND

Faults or weak points in electrical circuits may involve individual components in an electrical circuit having an excessive voltage, or a voltage with the wrong polarity applied to it, for example. The maximum voltages, which are permitted to be applied to the components in this case are dependent, inter alia, on the respective component type. By way of example, the maximum permissible voltage on a "thin oxide" field effect transistor is lower than that on a "thick oxide" field effect transistor.

It should also be remembered that in a complex electrical circuit—that is to say a network with different passive and active components (resistors, transistors, etc.), for example—the voltage potential on a component is dependent on the switching states of the respective upstream components. It is, therefore, also generally necessary to take into account the switching states of the components.

An electrical circuit is normally tested by performing circuit simulations in which the electrical response of the circuit is simulated. Although circuit simulations are useful for detecting the weak points in the design of the circuit, they have the drawback that the circuit response is examined only for the respective prescribed stimulus vector or a prescribed set of input voltages or other parameters (e.g., currents, temperature, etc.). A fault can, therefore, be found only if the stimulus vector or the set of parameters challenges the circuit in a way that produces and reveals a fault that the circuit contains. A further drawback of more detailed or more elaborate circuit simulations is relatively long computation times.

SUMMARY OF THE INVENTION

Embodiments of the invention generally specify methods and devices for testing an electrical circuit without an elaborate electrical circuit simulation and wherein circuit faults are reliably detected.

In accordance with an embodiment of the invention, a method for producing a test signal indicating that a prescribed circuit state defined at least by an electrical state variable can arise in an electrical circuit is provided. The method comprises treating all the electrical components of the electrical circuit as having each pair of connections on the components either shorted or nonconductive on a component-specific basis, assigning at least one network node or one connection pin of the electrical circuit an electrical state variable, allocating each network node and each connection pin all the electrical state variables of those network nodes and connection pins to which the respective network node or the respective connection pin is connected via the components' pairs of connections that are treated as shorted, and using at least the allocated state variables to establish whether the prescribed circuit state can arise.

In one aspect, an embodiment of the invention provides a method for producing a test signal that indicates that a prescribed circuit state defined at least by an electrical state variable can occur or does occur in an electrical circuit. This method involves all the electrical components of the electrical circuit being treated as having each pair of connections on the component either shorted or nonconductive on a component-specific basis.

In the case of components with just two connections or connection pins, the components are merely treated as being shorted or as being nonconductive. In the case of components with a plurality of connections, the links between all the possible pairs of connections are defined. By way of example, in the case of a component with three connections (e.g., a transistor) A1, A2 and A3, the links between the connections A1-A2, A1-A3 and A2-A3, therefore, each have a stipulation made regarding whether the link is to be treated as shorted or as nonconductive. In the case of three connections, three stipulations are thus used. In the case of a component with four connections (e.g., MOS transistor with a substrate connection, thyristor) A1, A2, A3 and A4, the links between the connections A1-A2, A1-A3, A1-A4, A2-A3, A2-A4 and A3-A4, therefore, each have a stipulation made regarding whether the link is to be treated as shorted or as nonconductive. In the case of four connections, six stipulations are thus used.

At least one network node or one connection pin of the electrical circuit is assigned an electrical state variable, for example firmly (or exclusively), in forming a "stop network." Each network node and each connection pin with the exception of the network nodes and connection pins with a firmly (or exclusively) assigned electrical state variable—that is to say with the exception of the stop networks—is then allocated all the electrical state variables of those network nodes and connection pins to which the respective network node or the respective connection pin is connected via the component's or components' pairs of connections that are to be treated as shorted. Next, the allocated state variables are used to test whether the prescribed switching state can arise. In this context, individual network nodes can be allocated two or more state variables.

In accordance with another embodiment of the invention, a computer system for producing a test signal indicating that a prescribed circuit state defined at least by an electrical state variable can arise in an electrical circuit is provided. The computer system for executing a method including treating treats all the electrical components of the electrical circuit as having each pair of connections on the component either shorted or nonconductive on a component-specific basis, assigning at least one network node or one connection pin of the electrical circuit an electrical state variable, allocates each network node and each connection pin with the exception of the network nodes and connection pins with a firmly assigned electrical state variable all the electrical state variables of those network nodes and connection pins to which the respective network node or the respective connection pin is connected via the components' pairs of connections that are to be treated as shorted, and using at least the allocated state variables to establish whether the prescribed circuit state can arise.

As an example, the device may be a microprocessor device or data processing installation.

In accordance with another embodiment of the invention, a data storage medium has a program that is in a form such that a data processing installation carries out, after the program has been installed, a method comprising treating all the electrical components of the electrical circuit as having each pair of connections on the components either shorted or nonconductive on a component-specific basis, assigning at least one network node or one connection pin of the electrical circuit an electrical state variable, allocating each network node and each connection pin all the electrical state variables of those network nodes and connection pins to which the respective network node or the respective connection pin is connected via the components' pairs of connections that are treated as shorted, and using at least the allocated state variables to establish whether the prescribed circuit state can arise.

An advantage of an embodiment of the invention is that it can be carried out very quickly because no elaborate or complete electrical simulation of the circuit needs to be performed. Instead, a static "allocation process" is carried out in which firmly assigned state variables about the network properties of the electrical circuit are statically "propagated" or copied. This allocation or copying or "propagation" of network properties allows this method to be carried out very quickly.

A further advantage of an embodiment of the invention is that fault coverage—i.e., the probability of detecting a fault—is close to 100% because the fault detection is performed independently of prescribed stimulus vectors.

The electrical state variables used in a preferred method may be voltage potentials or logic states, for example.

Preferably, all the transistors of at least one prescribed transistor type are treated as having their switching path shorted. In this context, the term "switching path" is understood to mean the source-drain path in the case of a field effect transistor or the emitter-collector path in the case of a bipolar transistor. This preferred embodiment of the invention makes use of the insight that transistors generally are expected to be able to connect the switching path fully and hence to transmit or "forward" the state variables that are present at the two ends of the switching path readily beyond the switching path.

Preferably, all the transistors are treated as having their switching path shorted.

With regard to the resistors in the electrical circuit, it is considered to be advantageous if all the resistors are treated as being shorted.

Alternatively, resistors with a resistance value below a prescribed limit value (for example 500 ohms or 1000 ohms) are treated as shorted and resistors with a resistance value above the prescribed limit value are treated as nonconductive. In this context, however, it may be that with the wrong choice of limit value it may no longer be possible to detect all circuit faults reliably. This embodiment takes into account the fact that low-value resistors pass on a voltage potential applied to one of their connections more or less "loss-free" to their other connection, whereas high-value resistors bring about a significant voltage drop that results in the voltage potential on the two connections of the resistor being able to be significantly different. Propagation of or copying network properties can, therefore, generally be difficult as a rule in the case of high-value resistors.

Depending on the electrical circuit to be tested, the test signal can be produced, by way of example, when at least one prescribed network node or at least one prescribed connection pin reaches or is below or above a prescribed limit voltage potential or reaches a prescribed logic state.

Alternatively or in addition, the test signal also may be produced when at least one prescribed component of the electrical circuit has a voltage applied to it that reaches or is below/above a limit voltage prescribed for the component.

In addition, the test signal also can be produced, by way of example, when at least one component of a prescribed component group or of a prescribed component type has a voltage applied to it that reaches or is below/above a limit voltage prescribed for the component group or for the component type.

So that any test signal produced can be evaluated particularly easily, it is considered to be advantageous if the test signal produced is a signal that identifies all the components of the prescribed component group or of the prescribed component type that reach or are below/above the prescribed limit voltage. Such a test signal simultaneously allows the fault to be located or allows the faulty component to be located.

The method may be carried out particularly easily and hence advantageously using a data processing installation, for example, into which the circuit structure of the electrical circuit, for example in the form of a "network list," is input.

BRIEF DESCRIPTION OF THE DRAWINGS

The invention is explained by way of example below with reference to three electrical circuits, where.

DETAILED DESCRIPTION OF ILLUSTRATIVE EMBODIMENTS

Figure 1:
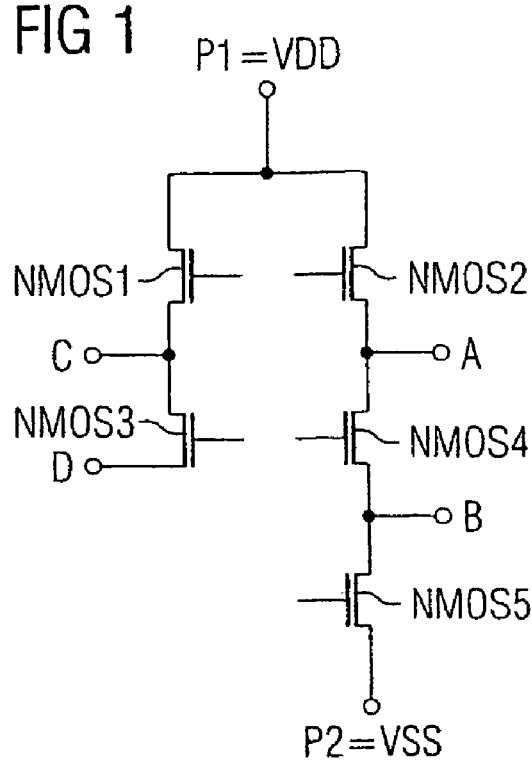
FIGS. 1 and 2 show a first electrical circuit.

FIG. 1 shows five MOS transistors NMOS1, NMOS2, NMOS3, NMOS4 and NMOS5. In this case, a switching path connection (i.e., source or drain connection) of the transistor NMOS5 is connected to a network node or to a network labeled P2. Another connection of the transistor NMOS5 is connected to a network B, to which a switching path connection of the transistor NMOS4 is also connected. The other switching path connection of the transistor NMOS4 is connected to a switching path connection of the transistor NMOS2 and also to a network A. The other switching path connection of the transistor NMOS2 is connected to a switching path connection of the transistor NMOS1 and also to a network P1. The other switching path connection of the transistor NMOS1 is electrically connected to a switching path connection of the transistor NMOS3 and also to a network C. The other switching path connection of the transistor NMOS3 forms a network D.

The two networks or network nodes P1 and P2 are each firmly assigned an electrical state variable, specifically the network P1 is assigned the supply voltage VDD and the network P2 is assigned the ground potential VSS.

In addition, the five transistors NMOS1 to NMOS5 are treated as being shorted. The firm assignment of the electrical state variables for the two networks P1 and P2 and also the treatment of the transistors NMOS1 to NMOS5 as being shorted can be achieved by the following programming instruction, for example:

```
ercDefines(
    defPins(
        pin "VSS" = "P2"
        pin "VDD" = "P1"
    )
    shortDevices(
        short "MOS"
        excludingPinTypes "VSS" "VDD"
    )
)
```

The fact that the five transistors NMOS1 to NMOS5 are treated as being shorted means that the voltage potentials VDD and VSS on the two networks P1 and P2 can now be assigned to all those networks that are connected to the networks P1 and P2 via the transistors.

In this case, however, it should be remembered that the two networks P1 and P2 have firmly assigned electrical potentials, namely the potentials VDD and VSS, which means that these two networks P1 and P2 can be regarded as "stop networks."

This means that the potential VSS on the network P2 reaches the network B via the transistor NMOS5, which is to be treated as being shorted, and reaches the network A via the transistor NMOS4, which is to be treated as shorted, or is "propagated" to these networks. As a result, the two networks A and B have thus each been assigned the potential VSS. In corresponding fashion, the potential VDD from network P1 will reach the network A via the transistor NMOS2, which is to be treated as being shorted, and the network B via the transistor NMOS4, which is to be treated as being shorted. As a result, the two networks A and B have thus each been assigned the two potentials VSS and VDD.

Figure 2:
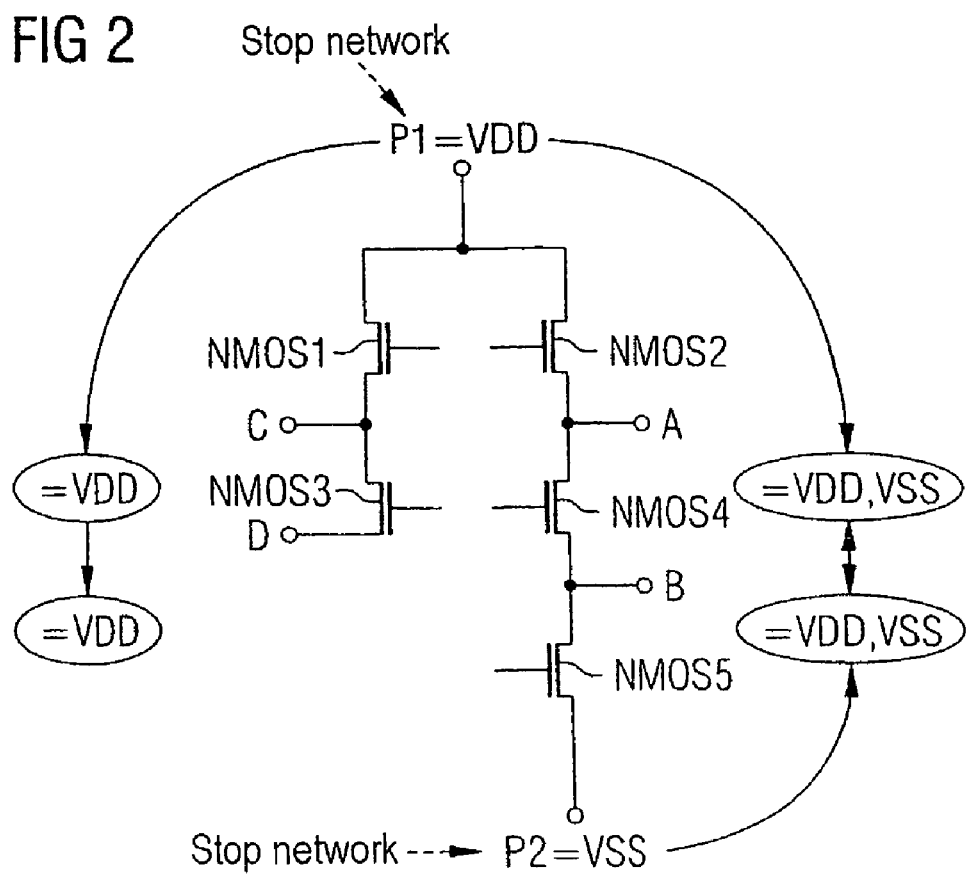

As can be seen in FIG. 2, however, there is no allocation of the potential VDD to the network P2 and likewise no allocation of the potential VSS to the network P1. The reason for this is that the two networks P1 and P2 form "stop networks" to which electrical state variables have been firmly allocated. In the example shown in FIGS. 1 and 2, the network P1 has been firmly assigned the potential VDD and the network P2 has been firmly assigned the potential VSS as presented above.

In corresponding fashion, the potential VDD is now allocated to the network C via the transistor NMOS1 treated as being shorted. This means that the potential VDD can also be allocated to the network D, since the transistor NMOS3 is also to be treated as being shorted.

Consequently, an association of voltage potentials thus forms, as shown in FIG. 2. This means that the two networks A and B have each been assigned the potentials VSS and VDD, and the two networks C and D have each been assigned the potential VDD. The two networks P1 and P2 retain their firmly assigned potentials VDD and VSS, since they are stop networks. The following thus applies:

P1: VDD
P2: VSS
A: VDD, VSS
B: VDD, VSS
C: VDD
D: VDD

The electrical circuits shown in FIGS. 1 and 2 can now be tested for whether a prescribed circuit state defined at least by an electrical state variable has been reached. This will be illustrated using an example in which a test signal is output for all those nodes that are not connected to the potential VDD or not connected to the potential VSS. An appropriate test in a programming language might have the following appearance:

```
ercRules(
    reportNet(
        pinTypes
        condition count "VSS" "VDD" <= 1
        title "No path to VDD or no path to VSS"
    )
)
```

As can be seen in FIG. 2, the networks P1, P2, C and D are reported. The networks P1 and P2 are reported because they are stop networks and cannot assume another potential. The networks C and D are reported because they cannot assume the potential VSS. A test signal is therefore produced.

Another test query might require that all networks or network nodes that are able to be at the potential VSS be output, for example. The corresponding search or test query in a programming language might have the following appearance:

```
ercRules(
    reportNet(
        pinTypes
    condition
        including "VSS"
        title "path to VSS"
    )
)
```

The result of this test query would be that the networks A and B and also P2 can be at the potential VSS. The network P1 cannot—as presented above—be at the potential VSS, because it is a stop network. Accordingly, the two networks C and D cannot be at the potential VSS either, since they merely have the potential VDD applied to them via the stop network P1.

Figure 3:
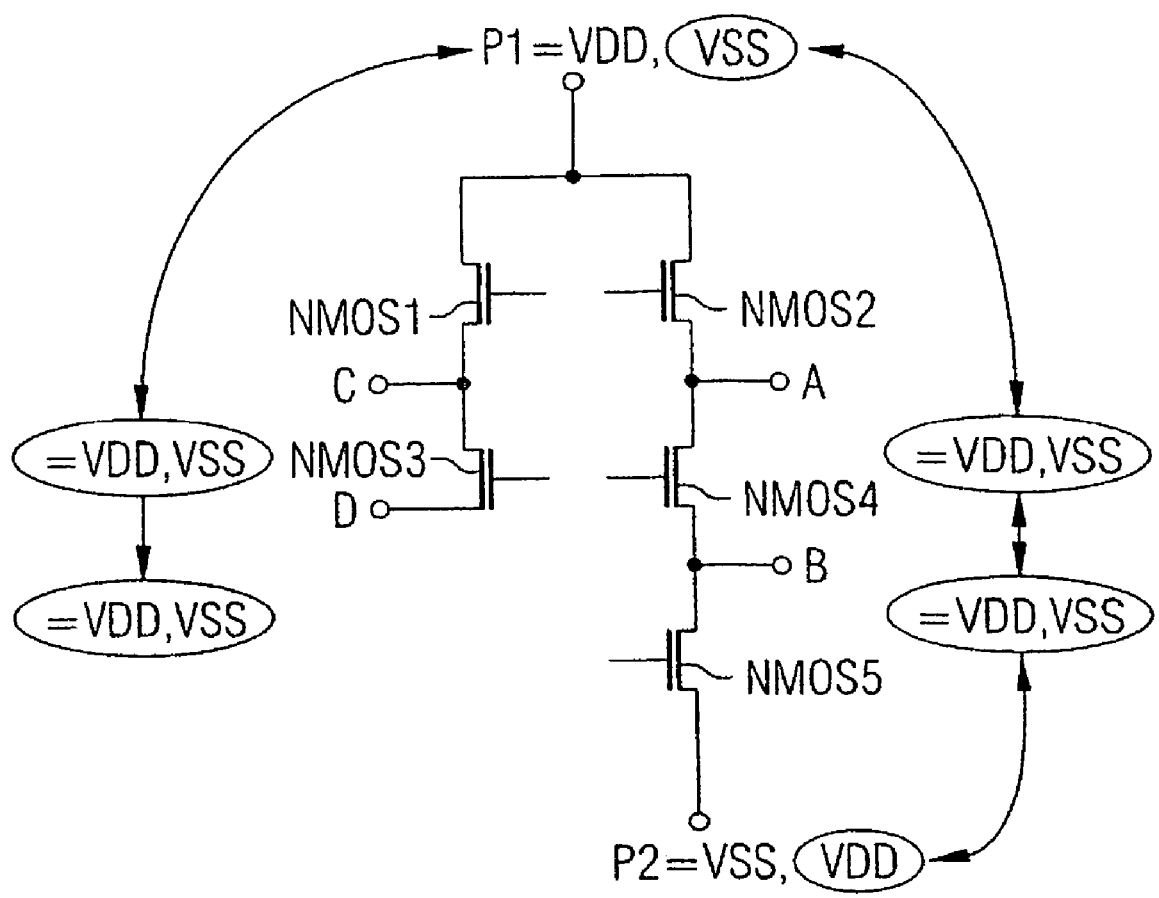
FIG. 3 shows a second electrical circuit.

FIG. 3 shows a modified form of the exemplary embodiment shown in FIGS. 1 and 2. In the electrical circuit shown in FIG. 3, the network P1 has been assigned the potential VDD and the network P2 has been assigned the potential VSS. Unlike the exemplary embodiment shown in FIGS. 1 and 2, however, this is not a firm assignment, which means that the two networks P1 and P2 do not form stop networks. Hence, the two networks P1 and P2 can also be assigned further, different potentials in addition to the previously allocated potentials VDD and VSS. The definition of the pin assignment or of the pin types of the networks and the shorting can be defined by the following program lines, for example:

```
ercDefines(
    defPins(
        pin "VSS" = "P2"
        pin "VDD" = "P1"
    )
    shortDevices(
        short "MOS"
    )
)
```

If the method explained in connection with FIGS. 1 and 2 is now applied here, the VSS allocated to the network P2 will reach the network B via the transistor NMOS5 treated as being shorted, and from there will reach the network A via the transistor NMOS4 treated as being shorted. In addition, the potential VSS will be able to reach the network P1 via the transistor NMOS2 treated as being shorted, since the network P1 no longer forms a stop network. From the network P1, the potential VSS then reaches the network C via the transistor NMOS1 and from there reaches the network D via the transistor NMOS3. Hence, the potential VSS can thus be applied to all the networks P1, P2, A, B, C and D.

In corresponding fashion, the potential VDD is now also allocated to the networks A, B, C and D—as in the above exemplary embodiment—and also via the transistor NMOS5 to the network P2, since the network P2 likewise no longer forms a stop network.

Consequently, all the networks may respectively have both potentials VSS and VDD. The following therefore applies:

P1: VDD, VSS
P2: VDD, VSS
A: VDD, VSS
B: VDD, VSS
C: VDD, VSS
D: VDD, VSS

Figure 4:
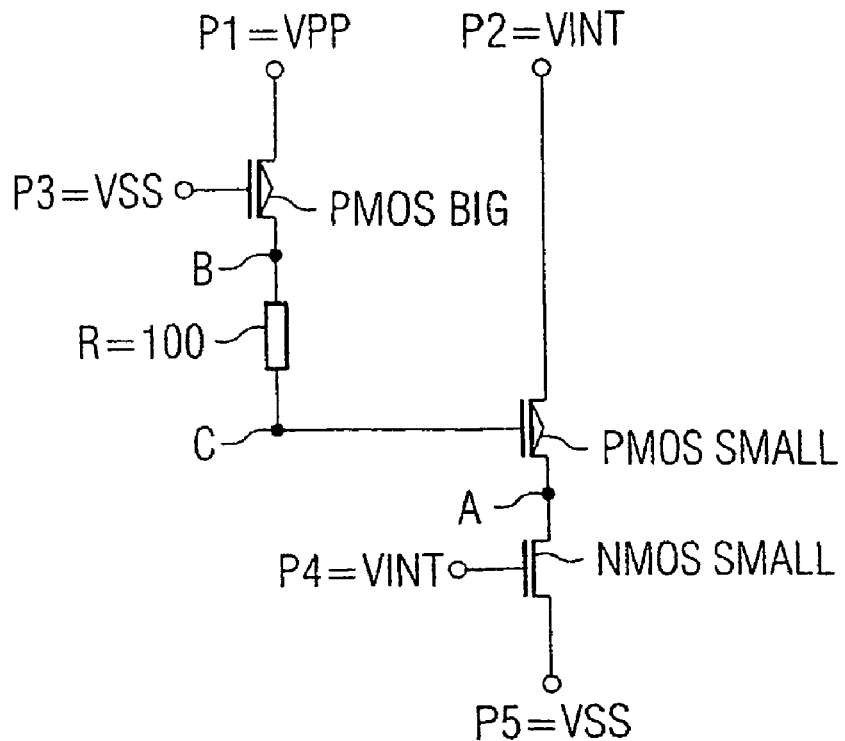
FIGS. 4 and 5 show a third electrical circuit.
Figure 5:
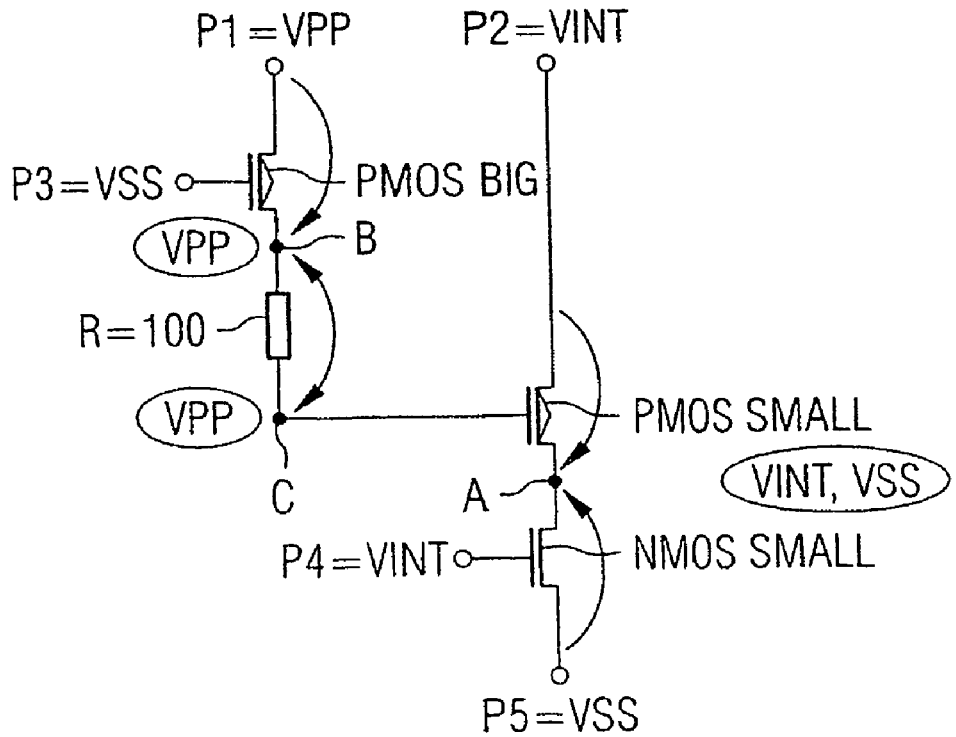

FIGS. 4 and 5 show a third electrical circuit, which is likewise used to explain the performance of the test method below.

FIG. 4 shows a "small" n-channel MOS field effect transistor NMOS SMALL, one of whose switching path connections—the source connection—is connected to the network P5. The network P5 has the potential VSS applied to it. The gate of the transistor NMOS SMALL is connected to P4 at the potential VINT. The other switching path connection—the drain connection—of the transistor NMOS SMALL is connected to a switching path connection—the drain connection—of a "small" p-channel MOS field effect transistor PMOS SMALL. The other switching path connection—the source connection—of the transistor PMOS SMALL is connected to a network P2, to which the potential VINT is applied.

The gate connection of the transistor PMOS SMALL is connected via a resistor R to a switching path connection of a "big" p-channel MOS field effect transistor PMOS BIG, whose other switching path connection is connected to the network P1. The gate connection of the transistor PMOS BIG is connected to a network P3, which has the potential VSS applied to it.

The networks P1, P2, P3, P4 and P5 are stop networks that may exclusively have their assigned potential.

All the resistors in the electrical circuit that have a resistance value of greater than 500Ω can be regarded as nonconductive, whereas all the other resistors with a resistance value of less than or equal to 500Ω are intended to conduct in ideal or loss-free fashion. Accordingly, the resistor R is treated as being shorted.

The relevant allocation of the potentials for the networks P1, P2, P3, P4 and P5 and also the definition of the electrical response of the components are achieved by means of the following programming rules, for example:

```
/* Allocation of pin types and voltages /
ercDefines(
    defPins(
        pin "VSS"    voltage 0     = "P5" "P3"
        pin "VINT"   voltage 2.0   = "P2" "P4"
        pin "VPP"    voltage 3.0   = "P1"
    )
)
```

-continued

```
/Definition of the devices to be used to transport the voltage
and of the stop networks */
    ShortDevices(
        short "MOS" BIG
        short "MOS" SMALL
        short "RES" value =< 500
        excludingPinTypes "VPP" "VINT" "VSS"
    )
```

The circuit shown in FIGS. 4 and 5 will now be tested to determine whether an excessive voltage can arise for the small p-channel transistor PMOS SMALL. The p-channel transistor PMOS SMALL is a transistor that should not have a voltage of greater than VINT applied between the gate connection and the source or drain connection. In line with the definition stated above, the voltage VINT is equal to 2 volts.

To perform the test, it is first necessary to establish which network nodes or which networks in the electrical circuit need to be allocated which potentials or states. The procedure for this is as follows:

It is first of all established that the network P2 is a stop network, which means that this network P2 can have only the potential VINT. However, the potential VINT can reach the network A via the transistor PMOS SMALL, which is to be treated as having its switching path or its source-drain connection pair shorted. In addition, the network A can also be allocated the potential VSS, since the transistor NMOS SMALL can also be considered as having its switching path or its source-drain connection pair shorted.

The potential VPP on the network P1 reaches the network B via the transistor PMOS BIG, which is to be treated as having its switching path or its source-drain connection pair shorted. Since the resistor R has only a resistance value of R=100Ω, this resistor can be regarded as shorted in line with the aforementioned rule; this means that the potential VPP can likewise be allocated to the network C and hence to the gate connection of the transistor PMOS SMALL.

An association of potentials thus forms, as shown in FIG. 5.

It can thus be established that the potentials VSS and VINT may arise on the network A and hence on the drain connection of the transistor PMOS SMALL, and the potential VPP may arise on the network C and hence on the gate connection of the transistor PMOS SMALL.

The electrical circuit will now be tested to determine whether a gate-source voltage or a gate-drain voltage, which is greater than VINT, is present on the "small" p-channel transistor PMOS SMALL. Such a test query may have the following appearance, for example:

```
/* Test rule */
reportDevice(
    "MOS"
        models SMALL
        condition nodeVoltage(voltage "GATE" - voltage
"SDRAIN" > "VINT") || nodeVoltage(voltage "SDRAIN" -
voltage "GATE" > "VINT")
            title "SMALL MOS, voltage difference Gate-
            Source/Drain/Substrate > VINT"
)
```

This test query tests whether there are "small" MOS field transistors whose gate connection and source or drain connection have a voltage applied between them that exceeds the voltage limit of VINT=2 V.

The solution to this test query can be taken directly from FIG. 5, which shows that the drain connection and the gate connection of the small p-channel transistor PMOS SMALL may have a gate-drain voltage Ugd of Ugd=VPP−VSS=3 volts and
Ugd=VPP−VINT=1 volt
applied between them.

If the gate connection has the potential VPP applied to it, a voltage difference of Ugd=3 V>2 V can thus form between the gate connection and the drain connection. The prescribed limit voltage or maximum voltage difference of Ugd=VINT=2 V is thus clearly exceeded.

The result of the test query would thus report the small p-channel transistor PMOS SMALL. The electrical circuit shown in FIGS. 4 and 5, therefore, does not have sufficient dimensions. Instead of the small p-channel transistor PMOS.SMALL, a "big" p-channel transistor PMOS BIG should be used, because in a MOS transistor of the type "BIG" a voltage difference of VDD between the gate and source or gate and drain connections would not be critical.

Alternatively, the electrical circuit shown in FIGS. 4 and 5 could be modified in a different way, for example by increasing the resistance value of the resistor R. This is because if the resistance value of the resistor R were to have a value of greater than 500Ω, the potential VPP across this resistor R would not be able to be "propagated" to the gate connection of the small p-channel transistor PMOS SMALL, so that no overvoltage would arise on the transistor. The transistor would then not be reported.

In addition, the test method described may also take into account further parameters of the electrical circuit. By way of example, a test to determine whether a prescribed limit voltage is being exceeded on a transistor may thus additionally be linked to geometrical parameters of the transistor. By way of example, all those "small" p-channel transistors in which the source connection and the drain connection have a voltage difference applied between them that is greater than VINT and whose gate length is less than 280 nm can be found using the test method described. An appropriate test query could have the following appearance, for example:

```
reportDevice(
  "MOS"
  models P_SMALL
    condition  length < 280 &&
      nodeVoltage(voltage "SDRAIN" > "vint") &&
      nodeVoltage(voltage "SOURCE" − voltage
"DRAIN" > "vint")
    title "Small PMOS, length < 280, voltage SOURCE-DRAIN > vint"
)
```

Consequently, the method described can thus be used to produce a full test on electrical circuits in a very simple manner without the need for a full electrical simulation of the circuit.

Figure 6:
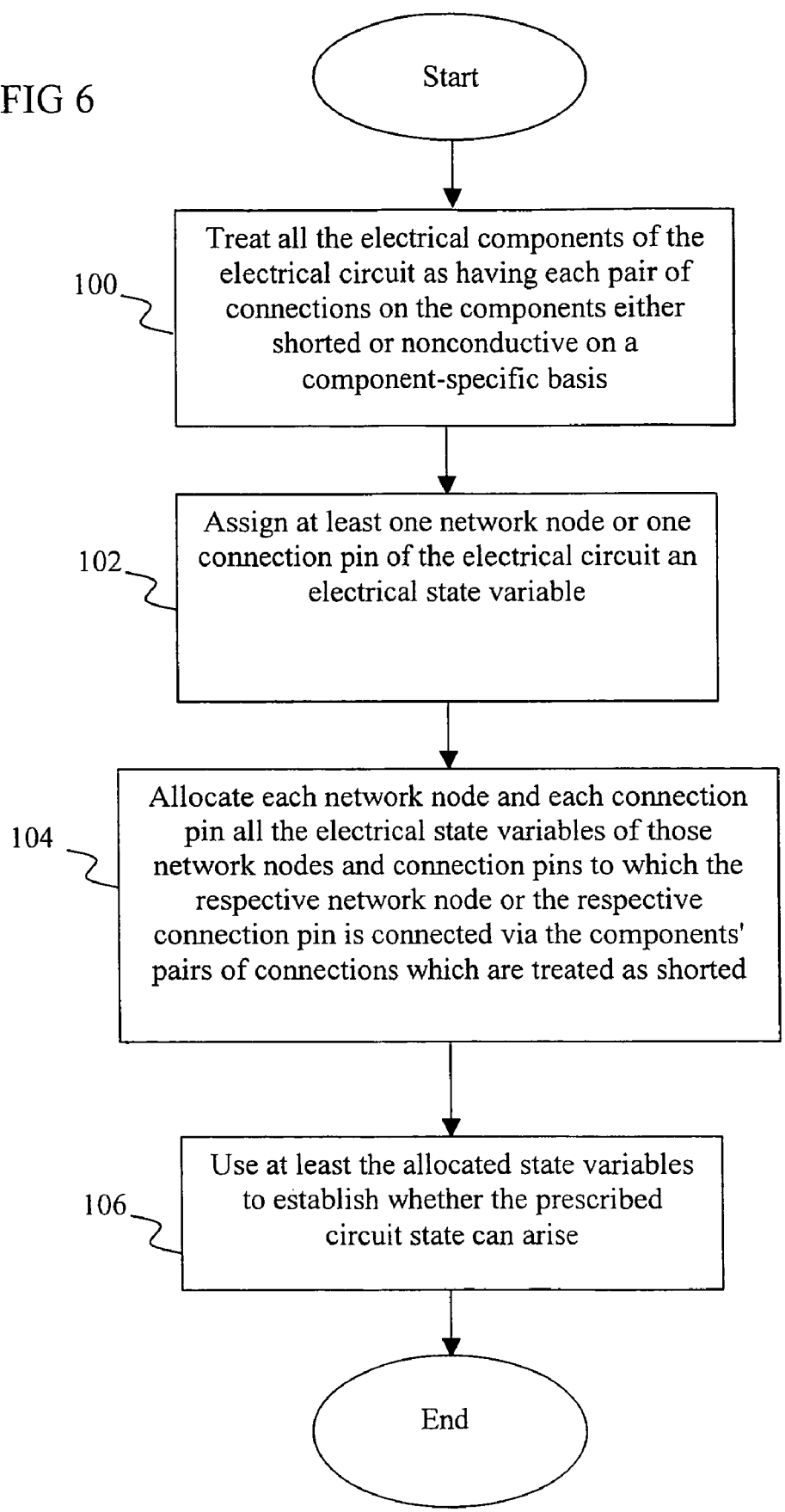
FIG. 6 is a flow chart of a preferred embodiment method.

FIG. 6 illustrates a flow chart of a preferred embodiment method. In step 100, all the electrical components of the electrical circuit are treated as having each pair of connections on the components either shorted or nonconductive on a component-specific basis. In step 102, at least one network node or one connection pin of the electrical circuit is assigned an electrical state variable. In step 104, each network node and each connection pin is allocated all the electrical state variables of those network nodes and connection pins to which the respective network node or the respective connection pin is connected via the components' pairs of connections that are treated as shorted. In step 106, at least the allocated state variables are used to establish whether the prescribed circuit state can arise.

Figure 7:
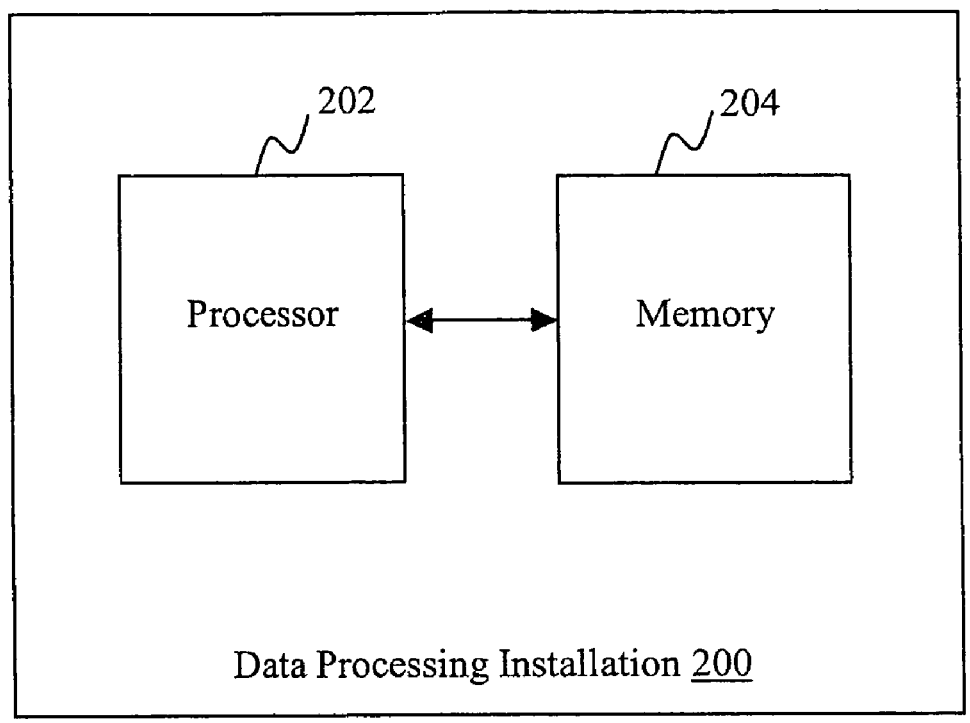
FIG. 7 is a block diagram of a preferred embodiment data processing installation.

FIG. 7 illustrates a block diagram of a preferred embodiment data processing installation 200. Data processing installation 200 includes a memory 204 for storing the circuit structure of an electrical circuit to be tested. Data processing installation 200 also includes processor 202 for executing a method of testing the electrical circuit. Processor 202 treats all the electrical components of the electrical circuit as having each pair of connections on the components either shorted or nonconductive on a component-specific basis, assigns at least one network node or one connection pin of the electrical circuit an electrical state variable, allocates each network node and each connection pin all the electrical state variables of those network nodes and connection pins to which the respective network node or the respective connection pin is connected via the components' pairs of connections that are treated as shorted, and uses at least the allocated state variables to establish whether the prescribed circuit state can arise.

In summary, embodiments described may have the following features:

1. Each pin or network or network node can be allocated a property or a potential or a voltage. By way of example, a pin connection or a network can be assigned the potential VINT or 1.8 V.

2. Components of the electrical circuit can be treated as being "conductive" or as being "nonconductive," depending on type (e.g., transistor model, resistor value).

3. Networks or network nodes can be defined such that they can have a fixed voltage and can never assume a different value. Such networks are called stop networks. This means that these stop networks cannot be used to "propagate" or transmit voltages or other properties to other networks.

3a. All the network properties are then copied or propagated via all conductive elements, that is to say via the components' pairs of connections, which are to be treated as shorted.

4. Following the conclusion of the electrical state variables being allocated to the networks of the electrical circuit, test queries are formulated that use the above definitions to test any component of the electrical circuit or any network or pin for prescribed properties. A test query may have the following appearance, for example: "Report thin oxide transistors whose voltage between the gate and source connections is greater than VINT" (example 3 above), or "Report all networks that can assume VINT potential." Similarly, rules and test queries can be formulated in which other parameters of the components—for example the gate length or other geometrical variables—are taken into account (cf., last example above).

In addition, the test rules can also be combined and the results of each test query can be processed further. By way of example, a test query may have the following appearance: "Form the sum of all the gate areas of all the n-MOS transistors whose gate-substrate voltage is between supply voltage VPP and ground (GND)."

The embodiments described allow the testing of an electrical circuit both in flat and in hierarchical circuits or network lists. In this context, voltages and/or other network properties are passed on or "propagated" statically via the components of the electrical circuit. "Stop networks" do not pass on any voltages or network properties in this case.

What is claimed is:

1. A method for producing a test signal indicating that a prescribed circuit state can occur in an electrical circuit, the method comprising:
treating all electrical components of the electrical circuit as having each pair of connections on the components either shorted or nonconductive on a component-specific basis;
assigning an electrical state variable to at least one network node or one connection pin of the electrical circuit, wherein the assigning comprises firmly assigning a firm electrical state variable in forming a stop network;
allocating each network node and each connection pin all of the electrical state variables of those network nodes and connection pins to which the respective network node or the respective connection pin is connected via the components' pairs of connections which are treated as shorted, wherein the allocating is not performed for the stop network;
using at least the allocated state variables to establish whether the prescribed circuit state can arise, occur in the electrical circuit; and
sending the test signal to a user, if the prescribed circuit state can occur.

2. The method as claimed in claim 1, wherein the electrical state variables used are voltage potentials or logic states.

3. The method as claimed in claim 1, further comprising treating all transistors of at least one prescribed transistor type as having their switching path shorted.

4. The method as claimed in claim 1, further comprising treating all resistors with a resistance value below a prescribed limit value as shorted and all the resistors with a resistance value above the prescribed limit value as nonconductive.

5. The method as claimed in claim 1, wherein the prescribed circuit state is a critical circuit state for the circuit.

6. The method as claimed in claim 1, wherein the prescribed circuit state is a critical circuit state for a plurality of critical switching states.

7. The method as claimed in claim 1, further comprising producing the test signal when at least one of the network nodes or connection pins reaches a prescribed limit voltage potential or a prescribed logic state.

8. The method as claimed in claim 1, further comprising producing the test signal when at least one of the network nodes or connection pins is above the prescribed limit voltage potential.

9. The method as claimed in claim 1, further comprising producing the test signal when at least one of the network nodes or connection pins is below the prescribed limit voltage potential.

10. The method as claimed in claim 1, wherein the test signal is produced when at least one prescribed component of the electrical circuit has a voltage applied to it that reaches a limit voltage prescribed for the component.

11. The method as claimed in claim 1, wherein the test signal is produced when the at least one prescribed component of the electrical circuit has a voltage applied to it that is above the limit voltage prescribed for the component.

12. The method as claimed in claim 1, wherein the test signal is produced when the at least one prescribed component of the electrical circuit has a voltage applied to it that is below the limit voltage prescribed for the component.

13. The method as claimed in claim 1, wherein the test signal is produced when at least one component of a prescribed component group or of a prescribed component type has a voltage applied to it that reaches a limit voltage prescribed for the component group or for the component type.

14. The method as claimed in claim 1, wherein the test signal is produced when the at least one component of the prescribed component group or of the prescribed component type has a voltage applied to it that is above the limit voltage prescribed for the component group or for the component type.

15. The method as claimed in claim 1, wherein the test signal is produced when the at least one component of the prescribed component group or of the prescribed component type has a voltage applied to it that is below the limit voltage prescribed for the component group or for the component type.

16. The method as claimed in claim 13, wherein the test signal produced is a signal that identifies all the components of the prescribed component group or of the prescribed component type that reach the prescribed limit voltage.

17. The method as claimed in claim 1, further comprising using a data processing installation, into which the circuit structure of the electrical circuit is input, to establish whether the prescribed circuit state can arise.

18. A computer system for producing a test signal indicating that a prescribed circuit state can occur in an electrical circuit, the computer system comprising:
a memory storing a circuit structure of the electrical circuit; and
a processor for producing a test signal indicating that a prescribed circuit state can occur in the electrical circuit, the processor executing computer-executable instructions comprising
means for treating all electrical components of the electrical circuit as having each pair of connections on the component either shorted or nonconductive on a component-specific basis,
means for assigning an electrical state variable to at least one network node or one connection pin of the electrical circuit, wherein the assigning comprises firmly assigning a firm electrical state variable in forming a stop network;
means for allocating each network node and each connection pin with the exception of the network nodes and connection pins with a firmly assigned electrical state variable all of the electrical state variables of those network nodes and connection pins to which the respective network node or the respective connection pin is connected via the components' pairs of connections that are to be treated as shorted, wherein the allocating is not performed for the stop network;
means for using at least the allocated state variables to establish whether the prescribed circuit state can occur in the electrical circuit; and
means for sending the test signal to a user, if the prescribed circuit state can occur.

19. The computer system as claimed in claim 18, wherein the processor uses voltage potentials or logic states as electrical states.

20. A computer-readable medium having computer-executable instructions for producing a test signal indicating that a prescribed circuit state can occur in an electrical circuit, said computer-executable instructions comprising:

means for treating all electrical components of an electrical circuit as having each pair of connections on the components either shorted or nonconductive on a component-specific basis;

means for assigning an electrical state variable to at least one network node or one connection pin of the electrical circuit, wherein the assigning comprises firmly assigning a firm electrical state variable in forming a stop network;

means for allocating each network node and each connection pin all of the electrical state variables of those network nodes and connection pins to which the respective network node or the respective connection pin is connected via the components' pairs of connections that are treated as shorted, wherein the allocating is not performed for the stop network;

means for using at least the allocated state variables to establish whether the prescribed circuit state can occur in the electrical circuit; and means for notifying a user if the prescribed circuit state can occur.

* * * * *

UNITED STATES PATENT AND TRADEMARK OFFICE
CERTIFICATE OF CORRECTION

PATENT NO. : 7,313,498 B2  
APPLICATION NO. : 11/372470  
DATED : December 25, 2007  
INVENTOR(S) : Baader et al.

Page 1 of 1

It is certified that error appears in the above-identified patent and that said Letters Patent is hereby corrected as shown below:

On the cover page, item (56), References Cited, OTHER PUBLICATIONS, Page 2, Column 1, 1st entry, delete "exploting" and insert --exploiting--.
In Col. 9, line 19, delete "PMOS.SMALL" and insert --PMOS SMALL--.
In Col. 11, line 22, delete "arise,".

Signed and Sealed this

Twenty-ninth Day of April, 2008

JON W. DUDAS  
*Director of the United States Patent and Trademark Office*